(12) United States Patent
Fukami

(10) Patent No.: US 7,800,384 B2
(45) Date of Patent: Sep. 21, 2010

(54) PROBE UNIT SUBSTRATE

(75) Inventor: Yoshiyuki Fukami, Chikusei (JP)

(73) Assignee: Micronics Japan Co., Ltd., Musashino-Shi (JP)

(*) Notice: Subject to any disclaimer, the term of this patent is extended or adjusted under 35 U.S.C. 154(b) by 67 days.

(21) Appl. No.: 12/353,813

(22) Filed: Jan. 14, 2009

(65) Prior Publication Data

US 2009/0128175 A1 May 21, 2009

Related U.S. Application Data

(62) Division of application No. 12/005,488, filed on Dec. 27, 2007, now Pat. No. 7,504,843.

(30) Foreign Application Priority Data

Dec. 28, 2006 (JP) .............................. 2006-354187

(51) Int. Cl.
*G01R 31/02* (2006.01)
(52) U.S. Cl. ...................... 324/754; 361/790; 361/795; 174/255
(58) Field of Classification Search ......... 324/754–762; 361/790, 795, 799; 438/14–18; 439/482; 174/255, 262; 257/700, 752, 758
See application file for complete search history.

(56) References Cited

U.S. PATENT DOCUMENTS 5,576,630 A * 11/1996 Fujita ......................... 324/760
6,229,095 B1 * 5/2001 Kobayashi ................... 174/255
6,521,843 B1 * 2/2003 Kohya ......................... 174/255
6,548,858 B2 * 4/2003 Cheng ......................... 257/324

FOREIGN PATENT DOCUMENTS

JP 2006-210473 A 8/2006

* cited by examiner

*Primary Examiner*—Ha Tran T Nguyen
*Assistant Examiner*—Arleen M Vazquez
(74) *Attorney, Agent, or Firm*—Frishauf, Holtz, Goodman & Chick, P.C.

(57) ABSTRACT

A ceramic substrate has, on its surface, a multilayer wiring division, on which micro cantilever type probes are fixed. The multilayer wiring division has the first conductor layer, which includes through-hole junction pads, flatness improvement rings surrounding the through-hole junction pads and a grounding region further surrounding the flatness improvement rings. Since the flatness improvement rings are located around the through-hole junction pads, the surface of the first insulating layer, which is located above the first conductor layer, is free from severe undulation even near the through-hole junction pads. Accordingly, the multilayer wiring division has less irregularity in shape as a whole, and thus the probe mounting pads on the surface of the second insulating layer do not slope but keep almost horizontal. The probe unit substrate according to the invention has an advantage of less surface undulation and having non-sloping probe mounting pads without using a complicated manufacturing process.

5 Claims, 13 Drawing Sheets

PROBE UNIT SUBSTRATE

CROSS-REFERENCE TO RELATED APPLICATIONS

The present application is a Divisional Application of U.S. application Ser. No. 12/005,488 filed Dec. 27, 2007 now U.S. Pat. No. 7,504,843, which is incorporated herein by reference.

BACKGROUND OF THE INVENTION

The present invention relates to a probe unit substrate having a feature of planarization or leveling of probe mounting pads.

In this specification, the phrase "probe unit" signifies a unit having plural probes for testing electronic parts or electrical parts, and thus it corresponds to, for example, a probe card used for testing an electrical circuit on a semiconductor wafer or a probe unit used for testing a liquid crystal display. Further, the phrase "probe unit substrate" signifies a substrate for the probe unit, which has an internal wiring and is possible to support plural probes.

FIG. 11 is an enlarged sectional view illustrating a part of a conventional probe unit substrate. A ceramic substrate 10 has a surface, on which the first conductor layer 12 is formed in a predetermined pattern. Above the first conductor layer 12 are formed the first insulating layer 14, the second conductor layer 16, and the second insulating layer 18 in order. On the surface of the second insulating layer 18 are formed a number of probe mounting pads 20. Micro cantilever type probes 22 are fixed to the respective probe mounting pads 20. The first conductor layer 12 is formed to be a predetermined pattern, and includes through-hole Junction pads 24 and a grounding region 26. The ceramic substrate 10 is formed with through-holes 28, and inner conductors of the through-holes 28 are connected with the through-hole junction pads 24. The through-hole junction pad 24 is prepared for the purpose of absorbing a positional displacement, which might be caused by thermal contraction of the through-hole conductor of the ceramic substrate 10. The through-hole junction pads 24 are connected to the second conductor layer 16.

A clearance between the through-hole junction pad 24 and a grounding region 26 is filled with the first insulating layer 14 deposited therein. Accordingly, the surface of the first insulating layer 14 becomes not flat but shows undulation. Such undulation spreads to the second conductor layer 16 and the second insulating layer 18. Besides, if the second conductor layer 16 is formed in a predetermined pattern, other undulation resulting from the pattern is also added. As a result, undulation appears on the surface of the second insulating layer 18. If the probe mounting pad 20 rests on such an uneven surface of the second insulating layer 18, the surface of the probe mounting pad 20 would be in danger of being non-flat or being inclined from the horizontal condition even with flatness. Further, if the micro cantilever type probes 22 are fixed to the respective such probe mounting pads 20, it could lead to variation in heights of tips 30 of a number of probes 22.

The surface undulation of the first insulating layer 14 will be alleviated if the clearance between the through-hole junction pad 24 and the grounding region 26 is reduced. However, there is a restriction in reduction of the clearance, as will be described below. FIG. 12A is a plan view illustrating a pattern of the first conductor layer 12 around the through-hole junction pad 24. The clearance 32 (a space having no conductor layer) is formed around the through-hole junction pad 24, and thus the through-hole junction pad 24 is separated from the grounding region 26 with a distance d. The distance d is a hundred micrometers, for example.

Since the surface undulation of the first insulating layer 14 is caused by existence of the clearance 32, it would be possible to alleviate such undulation if the distance d is reduced. That is, as shown in FIG. 12B, it might be possible to reduce the distance d down to twenty-five micrometers for example. However, if the distance d is reduced, another problem occurs as described below. As shown in FIG. 12C, when a foreign particle 34 gets stuck in the clearance 32, there is a risk of short circuit between the through-hole junction pad 24 and the grounding region 26. Therefore, it is not very preferable to reduce the distance d. Much the same is true in the case of short circuit caused by any wrong pattern instead of the foreign particle 34.

FIG. 13 is a sectional view illustrating in a magnified form a part of another structure of the conventional probe unit substrate. In this probe unit substrate, a multilayer wiring division 42 is composed of the first conductor layer 12, the first insulating layer 14, the second conductor layer 16, the second insulating layer 18, the third conductor layer 54, the third insulating layer 56, the fourth conductor layer 58, the fourth insulating layer 60, the fifth conductor layer 62 and the fifth insulating layer 64. On the surface of the fifth insulating layer 64 are formed a number of probe mounting pads 20. This conventional structure brings, as well as the conventional structure as shown in FIG. 11, irregularity to the surface of the first insulating layer 14 caused by the fact that the first insulating layer 14 is deposited in the clearance between the through-hole junction pad 24 and the grounding region 26. In addition, for example, the wiring patterns formed in the second conductor layer 16 and the fourth conductor layer 58 bring the irregularity to the surfaces of the insulating layers 18 and 60 disposed above the conductor layers 16 and 58. These irregularities spill over into the uppermost surface of the fifth insulating layer 64 so that the surfaces of the probe mounting pads 20 would not be flat or would be inclined from the horizontal condition no matter how flat the surface is.

By the way, the technique regarding planarization of a multilayer wiring substrate is known as described below. Concerning the technique for fixing a probe to a conductor layer (which corresponds to the probe mounting pad) formed on the uppermost layer of the multilayer wiring substrate, an improvement in the surface flatness of the multilayer wiring substrate is disclosed in Japanese Patent Publication No. 2006-210473 A (the first publication).

In the first publication, a covering resin layer having through-holes is formed on an insulating base, and the through-holes are filled with conductor layers. Accordingly, the height of the surface of the covering resin layer is almost the same as the heights of the surfaces of the conductor layers, resulting in no irregularity. Then, an insulating resin layer and a wiring conductor layer can be formed above a combination of the above-described covering resin layer and the conductor layers. Accordingly, the surface irregularity of the multilayer wiring substrate is alleviated, and a conductor layer is formed on the surface of the multilayer wiring substrate and a number of probes are fixed to the conductor layer without variation in heights of the tips of the probes.

According to the above-described technique disclosed in the first publication, the surface irregularity of the multilayer wiring substrate is reduced, but the manufacturing process will be complicated to form "a covering resin layer having through-holes". According to the first publication, formation of the through-hole in the covering resin layer requires 1) oxygen plasma treatment on the top side of the covering resin layer with the use of a metal layer as a mask, or 2) laser processing for removing a part of the covering resin layer to form through-holes.

SUMMARY OF THE INVENTION

It is an object of the present invention to provide a probe unit substrate in which the surface irregularity is alleviated without a complicated manufacturing process so that the probe mounting pads neither undulate nor slope. The probe unit substrate according to the present invention is characterized in formation of flatness improvement rings or planarization patterns in the multilayer wiring division so that the probe mounting pads keep the flat and horizontal conditions. The probe unit substrate according to the first aspect of the present invention has flatness improvement rings, and thus comprises: (a) an electrical insulating substrate having a surface; (b) a first conductor layer formed on the surface of the substrate, the first conductor layer including: first conductor patterns; flatness improvement rings surrounding the first conductor patterns with first clearances therebetween; and a second conductor pattern surrounding the flatness improvement rings with second clearances therebetween; (c) a first insulating layer covering over the first conductor layer; (d) at least one other conductor layer formed above the first insulating layer, and at least one other insulating layer covering over the other conductor layer; and (e) probe mounting pads formed on a surface of an uppermost insulating layer of the at least one other insulating layer.

It should be noted, in the present specification, that the words "above" and "beneath" signify the directions described below. The word "above" signifies a direction from the electrical insulating substrate toward the probe mounting pads, and the word "beneath" signifies the opposite direction. Therefore, the words "above" and "beneath" have no connection to the posture of the probe unit substrate and its components against the gravity.

The probe unit substrate according to the second aspect of the present invention has planarization patterns, and thus comprises: (a) an electrical insulating substrate having a surface; (b) a first conductor layer formed on the surface of the substrate; (c) a first insulating layer covering over the first conductor layer; (d) at least one other conductor layer formed above the first insulating layer, and at least one other insulating layer covering over the other conductor layer; and (e) probe mounting pads formed on a surface of an uppermost insulating layer of the at least one other insulating layer. Further, the probe unit substrate according to the second aspect has a feature in which: at least one of the at least one other conductor layer has a conductor pattern and planarization patterns insulated from the conductor pattern; each of the planarization patterns has a plane size greater than the probe mounting pad; and the planarization patterns are located beneath the probe mounting pads.

The probe unit substrate according to the third aspect of the present invention has both flatness improvement rings and planarization patterns, and thus comprises: (a) an electrical insulating substrate having a surface; (b) a first conductor layer formed on the surface of the substrate, the first conductor layer including: first conductor patterns; flatness improvement rings surrounding the first conductor patterns with first clearances therebetween; and a second conductor pattern surrounding the flatness improvement rings with second clearances therebetween; (c) a first insulating layer covering over the first conductor layer; (d) at least one other conductor layer formed above the first insulating layer, and at least one other insulating layer covering over the other conductor layer; and (e) probe mounting pads formed on a surface of an uppermost insulating layer of the at least one other insulating layer. Further, the probe unit substrate according to the third aspect has a feature in which: at least one of the at least one other conductor layer has a third conductor pattern and planarization patterns insulated from the third conductor pattern; each of the planarization patterns has a plane size greater than the probe mounting pad; and the planarization patterns are located beneath the probe mounting pads.

The probe unit substrate according the present invention has an advantage that the surface irregularity of the multilayer wiring division is alleviated so that the probe mounting pads on its surface neither undulate nor slope because of the formation of the flatness improvement rings or the planarization patterns as described above. Therefore, there is no variation in heights of the tips of the probes that are fixed to a number of the probe mounting pads respectively.

DETAILED DESCRIPTION OF THE PREFERRED EMBODIMENTS

Figure 1:
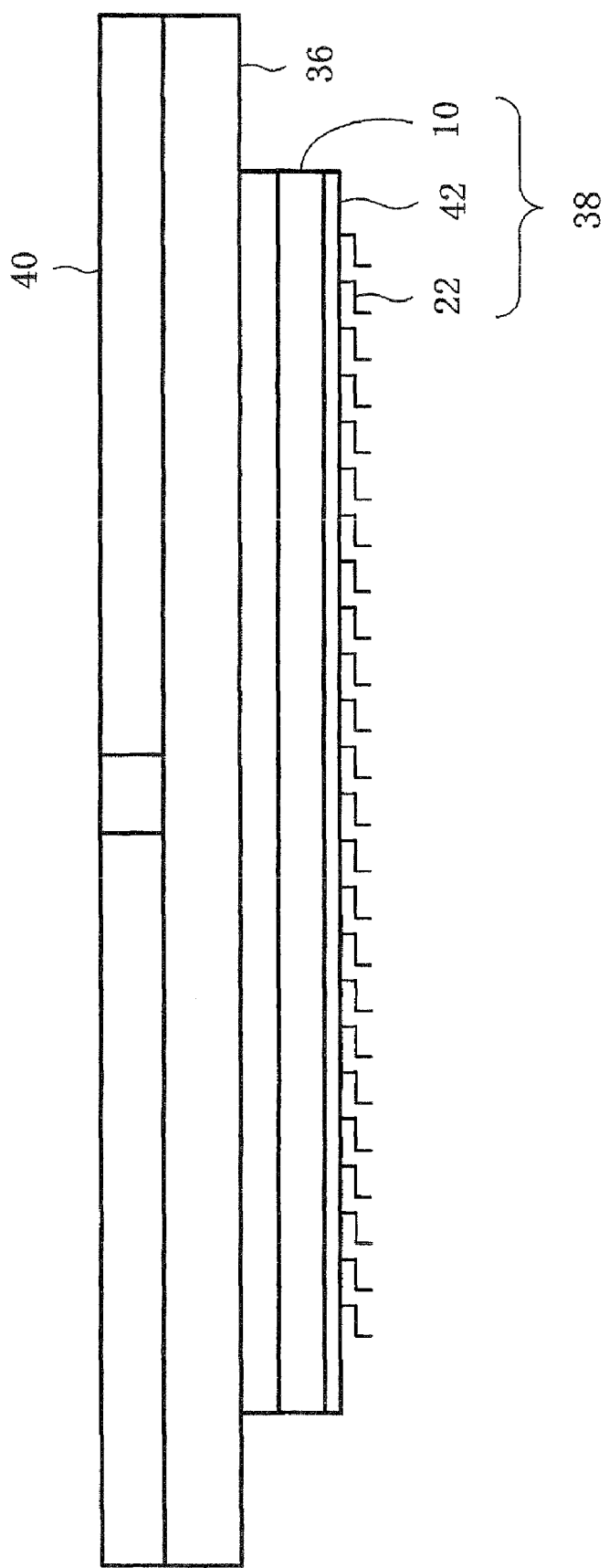
FIG. 1 is an elevation view of the probe card provided with the probe unit substrate according to the present invention.

Embodiments of the present invention will be described in detail below with reference to the drawings. FIG. 1 is an elevation view of the probe card provided with a probe unit substrate according to the present invention. A probe unit substrate 38 is fixed to one side of a wiring substrate 36, and a reinforcing plate 40 is fixed to the other side of the wiring substrate 36. The probe unit substrate 38 is equipped with a ceramic substrate 10 and a multilayer wiring division 42. On the surface of the ceramic substrate 10 is formed the multilayer wiring division 42 made of thin films, on the surface of which are formed a number of probe mounting pads. Micro cantilever type probes 22 are fixed to the respective probe mounting pads.

Figure 2:
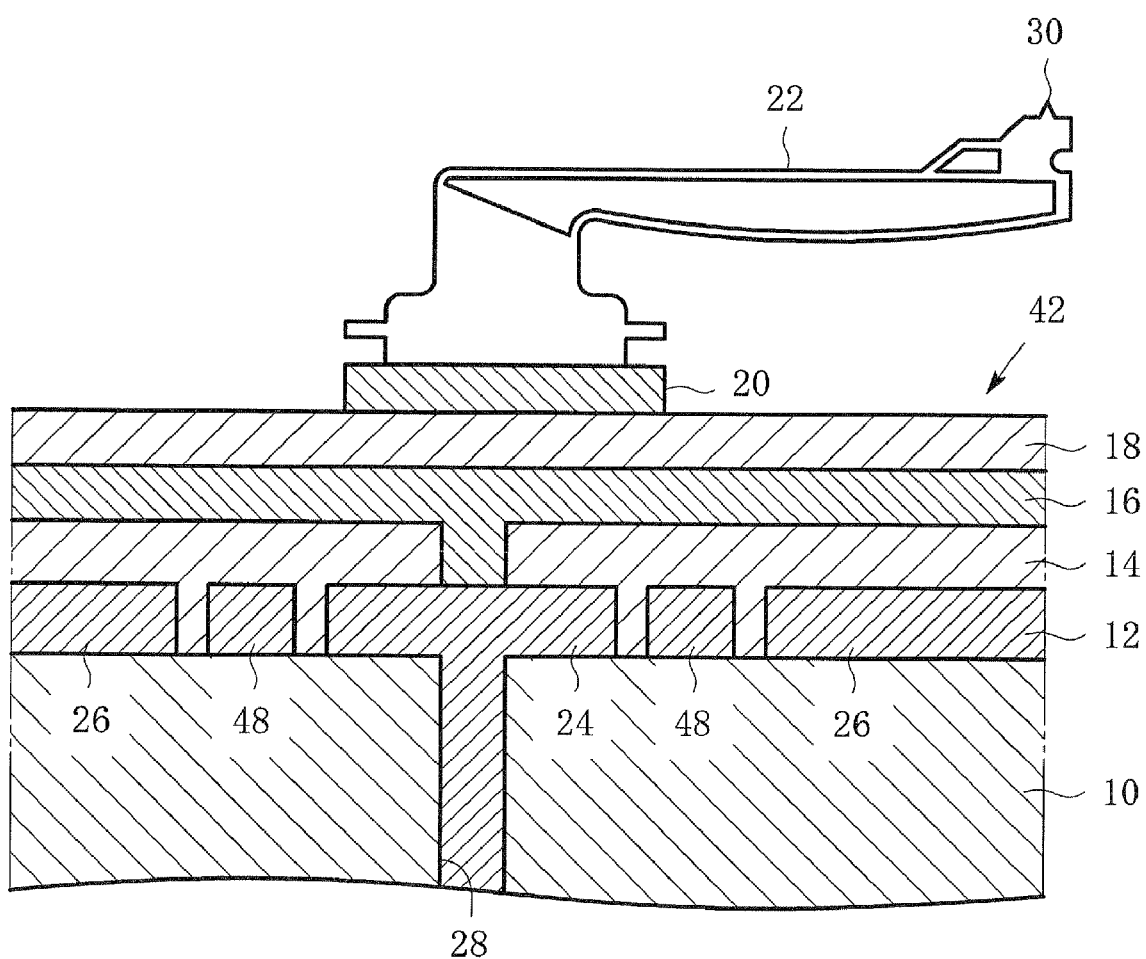
FIG. 2 is a side sectional view of a part of the probe unit substrate according to the first embodiment of the present invention.

FIG. 2 is a side sectional view of a part of the probe unit substrate according to the first embodiment of the present invention. On the ceramic substrate 10 is formed the multilayer wiring division 42, on which the micro cantilever type probes 22 are fixed. The ceramic substrate 10 corresponds to the electrical insulating substrate in the present invention. The multilayer wiring division 42 consists of the first conductor layer 12, the first insulating layer 14, the second conductor layer 16 and the second insulating layer 18. The first conductor layer 12 includes through-hole junction pads 24, flatness improvement rings 48 that surround the through-hole junction pads 24, and a grounding region 26 that further surrounds the flatness improvement rings 48. The ceramic substrate 10 is formed with through-holes 28. Conductors buried inside the through-holes 28 are connected with the through-hole junction pads 24 respectively. The through-hole junction pad 24 is formed for the purpose of absorbing a positional displacement that might be caused by heat shrinkage of the through-hole conductor in the ceramic substrate 10. The through-hole junction pad 24 is connected, via the conductor inside the through-hole 28, to a wiring on the other side of the ceramic substrate 10. On the other hand, the through-hole junction pad 24 is connected to the second conductor layer 16. On the surface of the second insulating layer 18 are formed a number of probe mounting pads 20. On the probe mounting pad 20 is fixed the root of a probe 22. As the flatness improvement ring 48 exists around the through-hole junction pad 24, the surface of the first insulating layer 14 never billows near the through-hole junction pad 24. Accordingly, the multilayer wiring division 42 has smaller undulation as a whole, and thus the probe mounting pad 20 on the second insulating layer 18 never undulates. Further, the probe mounting pad 20 never slopes but keeps horizontal. Therefore, the probes 22 that are fixed to the probe mounting pads 20 have no variation in heights of their tips 30.

Figure 3A:
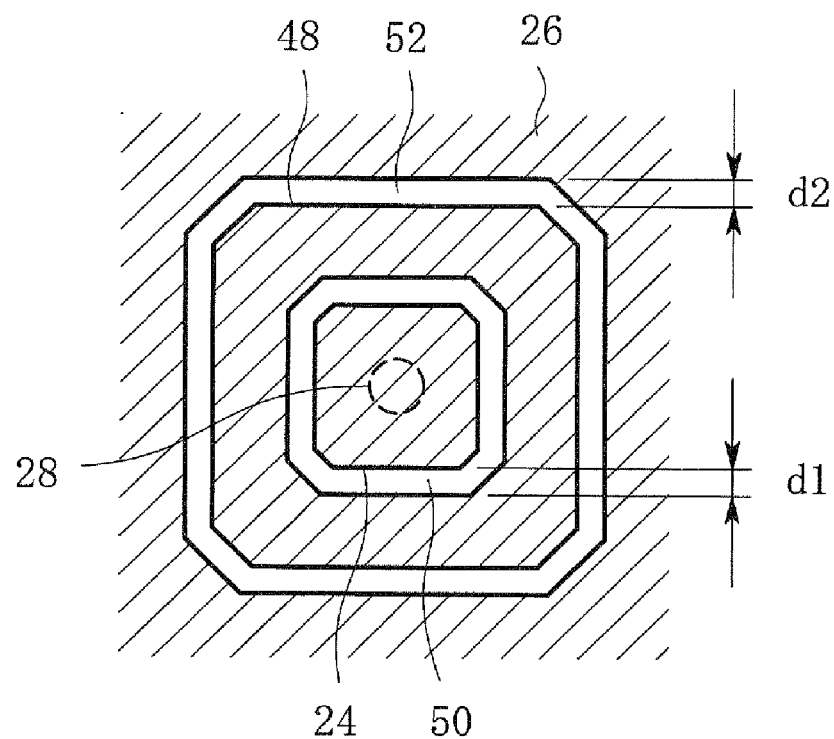
FIGS. 3A and 3B are plan views illustrating a pattern near the through-hole junction pad of the first conductor layer in the first embodiment of the present invention.
Figure 12A:
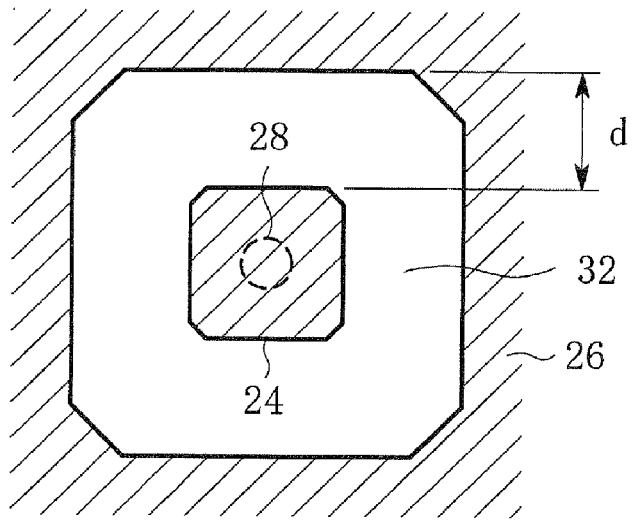
FIGS. 12A, 12B and 12C are plan views illustrating a pattern around the through-hole junction pad of the first conductor layer in the prior art.

FIG. 3A is a plan view illustrating a pattern near the through-hole junction pad 24 of the first conductor layer 12 (see FIG. 2). The center on the backside of the through-hole junction pad 24 is connected to the through-hole 28. Around the through-hole junction pad 24 is formed the flatness improvement ring 48 with the first clearance 50 therebetween. Further, around the flatness improvement ring 48 is formed a grounding region 26 with the second clearance 52 therebetween. The through-hole junction pad 24 corresponds to the first conductor pattern in the present invention, and the grounding region 26 corresponds to the second conductor pattern in the present invention. The flatness improvement ring 48 surrounds the through-hole junction pad 24 with the first clearance 50 therebetween, and further the grounding region 26 surrounds the flatness improvement ring 48 with the second clearance 52 therebetween. The distance d1 of the first clearance 50 is 25 micrometers for example, and the distance d2 of the second clearance is 25 micrometers for example. The width of the flatness improvement ring 48 is 520 micrometers for example. As the distances d1 and d2 are smaller than the clearance d in the prior art (see FIG. 12A), the surface drop of the first insulating layer 14 (see FIG. 2) near the first clearance 50 and the second clearance 52 is alleviated, so that the surface undulation of the first insulating layer 14 is reduced.

Figure 3B:
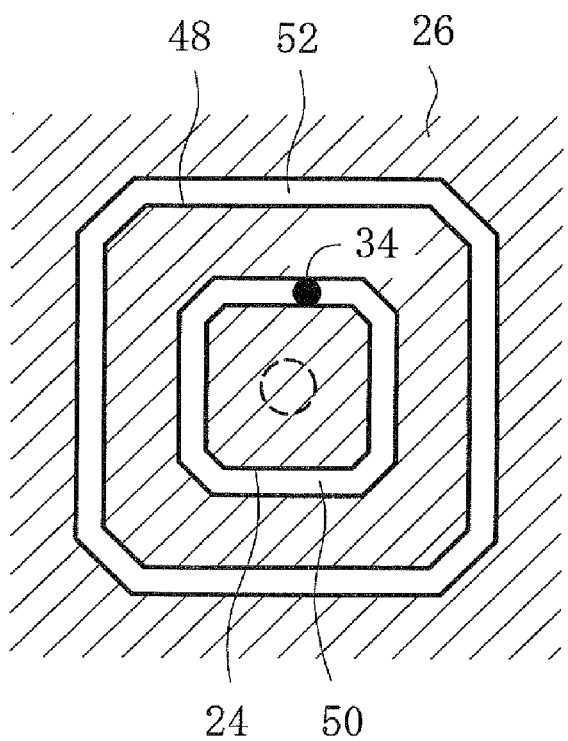
Figure 12B:
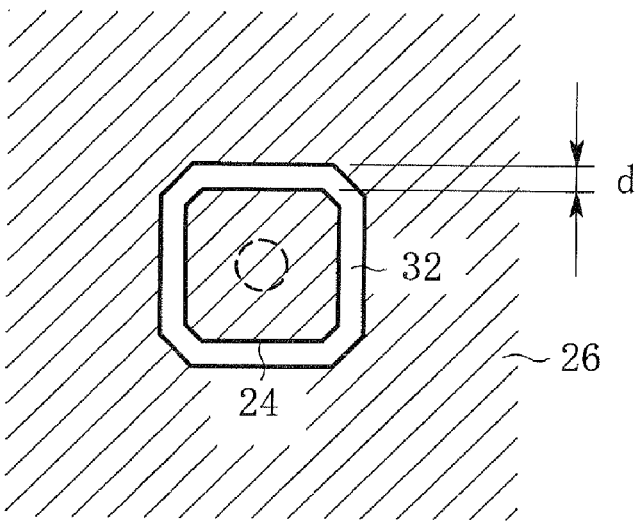
Figure 12C:
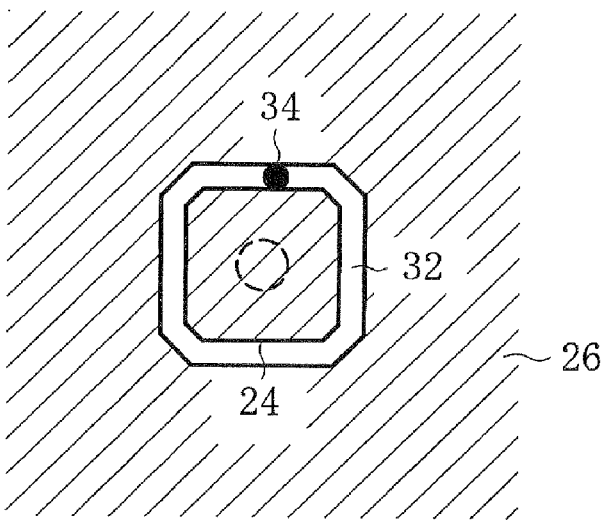
Figure 13:
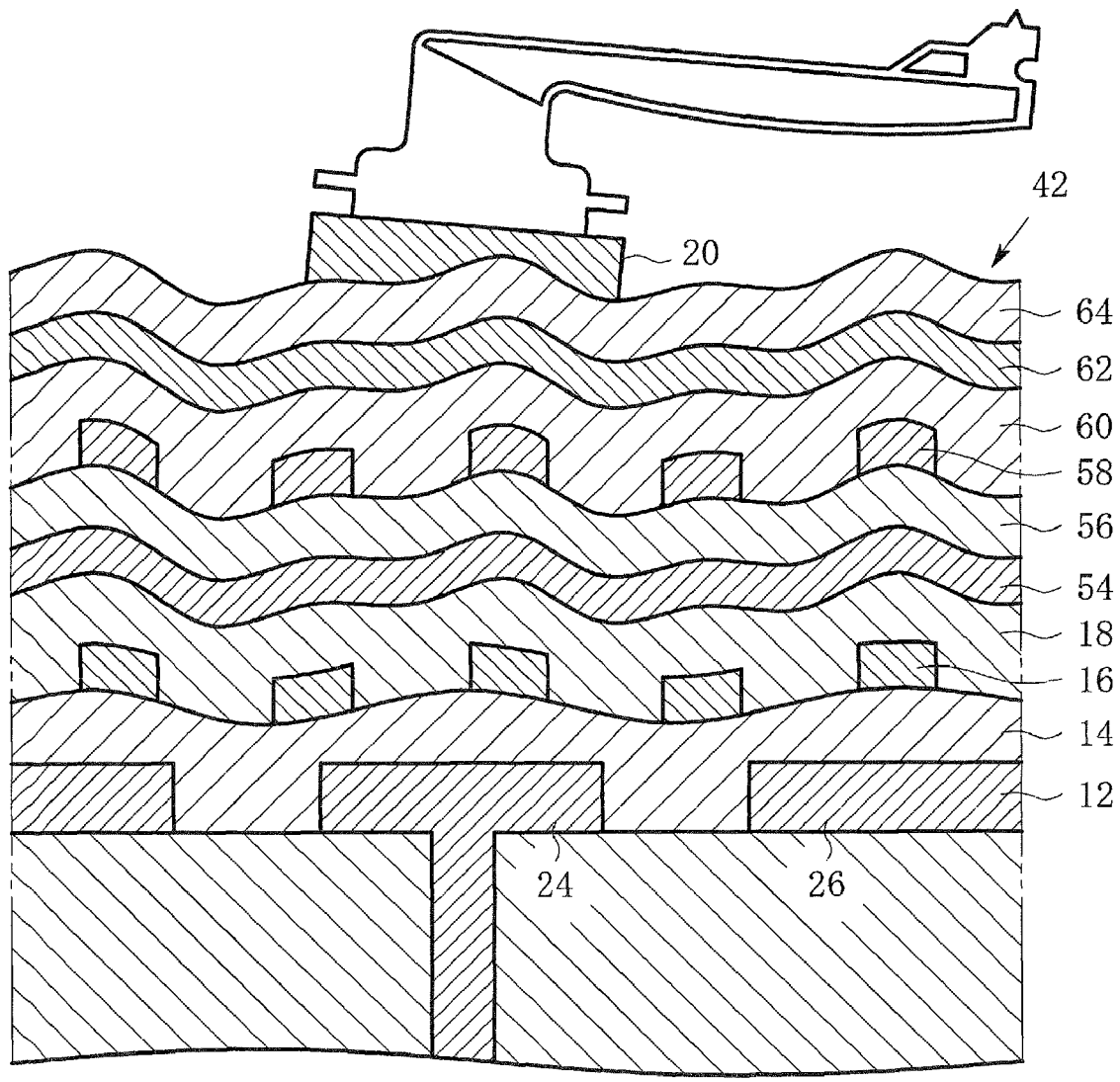
FIG. 13 is a sectional view illustrating a part of another conventional probe unit substrate in a magnified form.

Now, the risk of short circuit will be described. As shown in FIG. 3B, it is assumed that a foreign particle 34 gets stuck in the first clearance 50. Since the distance of the first clearance 50 is set small, if the foreign particle 34 gets stuck therein the short circuit might occur between the through-hole junction pad 24 and the flatness improvement ring 48. The through-hole junction pad 24, however, never short-circuits with the grounding region 26 because the flatness improvement ring 48 is insulated from the grounding region 26. Much the same is true if the foreign particle gets stuck in the second clearance 52 instead of in the first clearance 50. Nevertheless, if foreign particles get stuck in both of the first clearance 50 and the second clearance 52, there would be a risk of the short circuit between the through-hole junction pad 24 and the grounding region 26, a possibility of such a situation being extremely low. Accordingly, comparing to the conventional pattern shown in FIG. 12B, the risk of short circuit is remarkably reduced.

Figure 4:
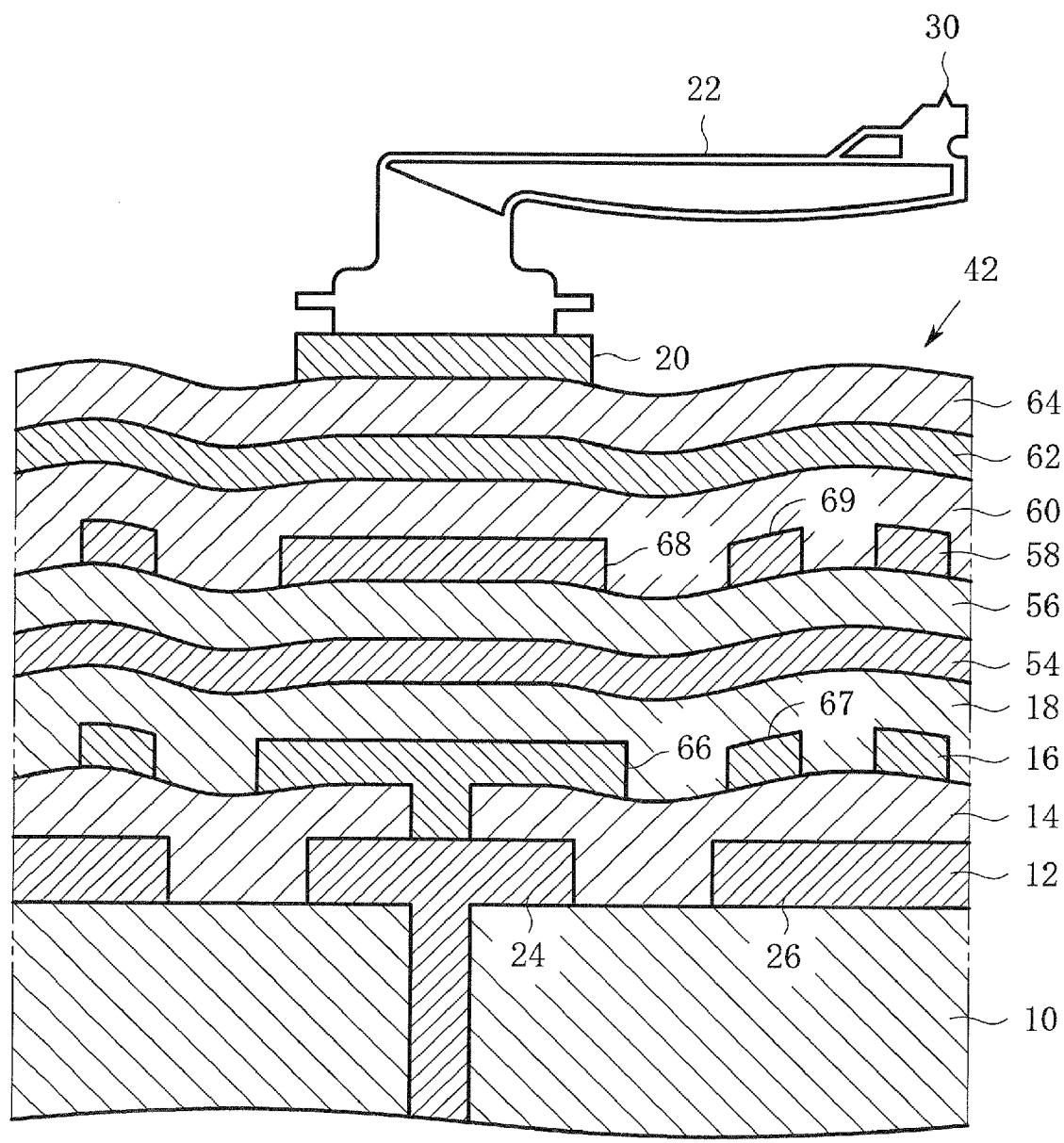
FIG. 4 is a side sectional view of a part of the probe unit substrate according to the second embodiment of the present invention.

FIG. 4 is a side sectional view of a part of the probe unit substrate according to the second embodiment of the present invention. This embodiment has no above-described flatness improvement ring but planarization patterns. The multilayer wiring division 42 in this embodiment consists of the first conductor layer 12, the first insulating layer 14, the second conductor layer 16, the second insulating layer 18, the third conductor layer 54, the third insulating layer 56, the fourth conductor layer 58, the fourth insulating layer 60, the fifth conductor layer 62, and the fifth insulating layer 64. On the surface of the fifth insulating layer 64 are formed a number of probe mounting pads 20.

The first conductor layer 12 includes the through-hole junction pads 24 and the grounding region 26 that surrounds the through-hole junction pads 24, but has no flatness improvement ring. The second conductor layer 16, the third conductor layer 54 and the fourth conductor layer 58 are wiring layers. On the other hand, the fifth conductor layer 62 is a grounding layer. The second conductor layer 16 includes planarization patterns 66 and a predetermined conductor pattern 67. The predetermined conductor pattern 67 corresponds to the third conductor pattern in the present invention. The fourth conductor layer 58 also includes planarization patterns 68 and a predetermined conductor pattern 69. The predetermined conductor pattern 69 also corresponds to the third conductor pattern in the present invention. The planarization patterns 66 and 68 are located beneath the probe mounting pads 20. The planar sizes of these planarization patterns 66 and 68 are larger than the planar size of the probe mounting pad 20. Further, the planar size of the lower planarization pattern 66 is larger than the planar size of the upper planarization pattern 68. Namely, comparing these planar sizes, there is a relationship that the probe mounting pad 20 is smaller than the planarization pattern 68, which is further smaller than the planarization pattern 66. For example, the probe mounting pad 20 is 120 micrometers square in planar size, the planarization pattern 68 is 150 micrometers square, and the planarization pattern 66 is 180 micrometers square. The planarization patterns 66 and 68 are intended to erase the boundary (which is the planar boundary between the conductor layer and the insulating layer) beneath the probe mounting pads 20. The planarization patterns 66 and 68 reduce, in the vicinity of the planarization patterns 66 and 68, the surface undulation of the second insulating layer 18 located above the planarization pattern 66 and the surface undulation of the fourth insulating layer 60 located above the planarization pattern 68. As a result, the surface undulation of the fifth insulating layer 64 is reduced in the vicinity of the probe mounting pads 20. Accordingly, the probe mounting pads 20 never undulate and keep almost horizontal. Therefore, the probes 22, which are fixed to such probe mounting pads 22, have no variation in heights of their tips 30. The planarization patterns 66 and 68 are preferably electrically connected with different patterns made of respective identical conductor layers, noting that it does not matter what kind of an electrical potential for the different pattern.

Figure 5:
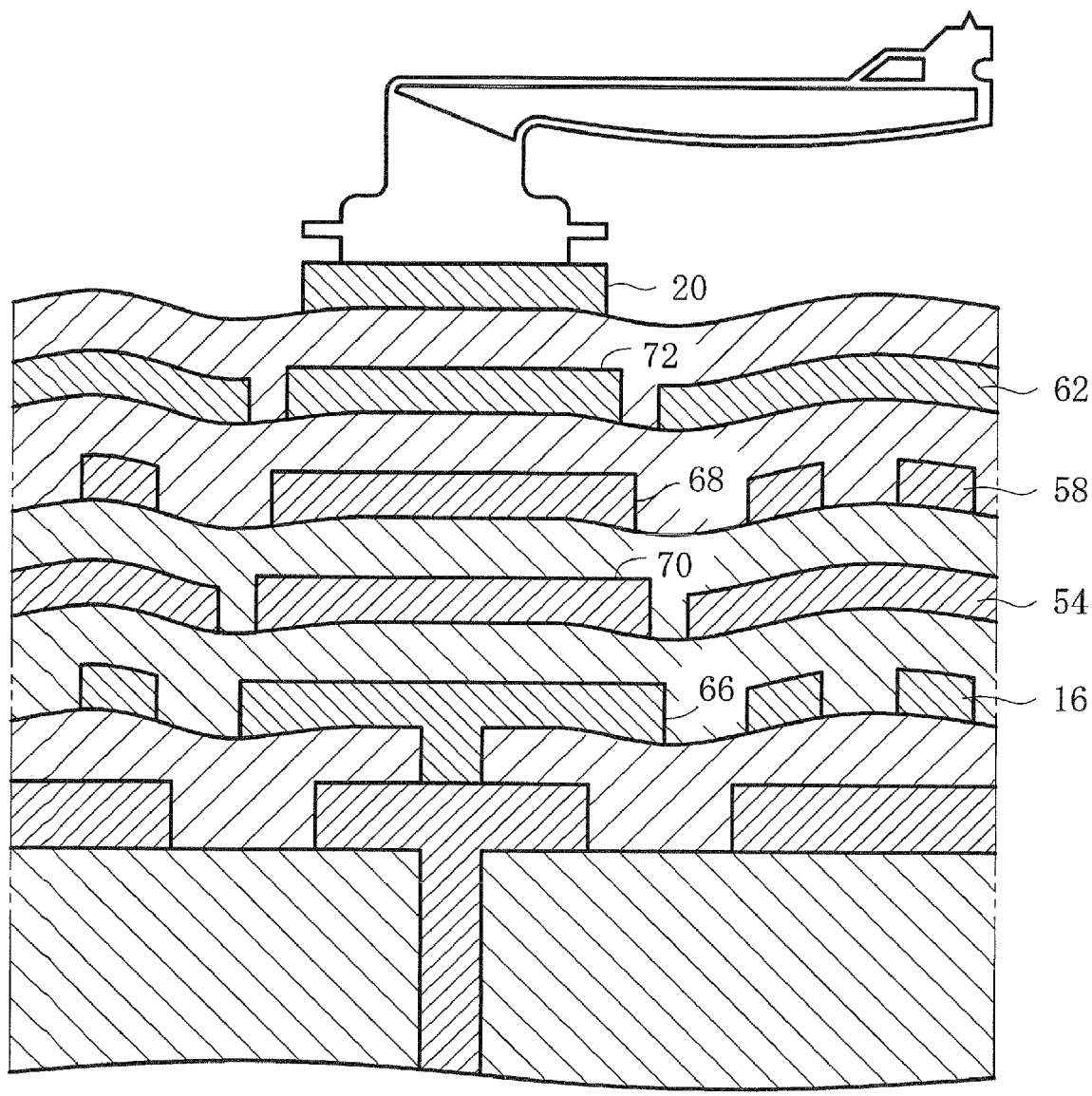
FIG. 5 is a side sectional view of a part of the probe unit substrate according to the third embodiment of the present invention.

FIG. 5 is a side sectional view of a part of the probe unit substrate according to the third embodiment of the present invention. This embodiment is similar to the second embodiment shown in FIG. 4, but it differs from the second embodiment in the point that the third conductor layer 54 also includes planarization patterns 70 and the fifth conductor layer 62 also includes planarization patterns 72. These planarization patterns 70 and 72 are also located beneath the probe mounting pads 20 and have the planar sizes larger than the planar size of the probe mounting pads 20. In the third embodiment, all of the conductor layers 16, 54, 58 and 62 ranging from the second conductor layer 16 to the fifth conductor layer 62 include planarization patterns 66, 70, 68 and 72. The planar sizes of these planarization patterns become larger when located lower, that is, there is a relationship in size that the probe mounting pad 20 is smaller than the planarization pattern 72, which is smaller than the planarization pattern 68, which is smaller than the planarization pattern 70, which is smaller than the planarization pattern 66. For example, the probe mounting pad 20 is 120 micrometers square in planar size, the planarization pattern 72 is 135 micrometers square, the planarization pattern 68 is 150 micrometers square, the planarization pattern 70 is 165 micrometers square, and the planarization pattern 66 is 180 micrometers square.

Figure 6:
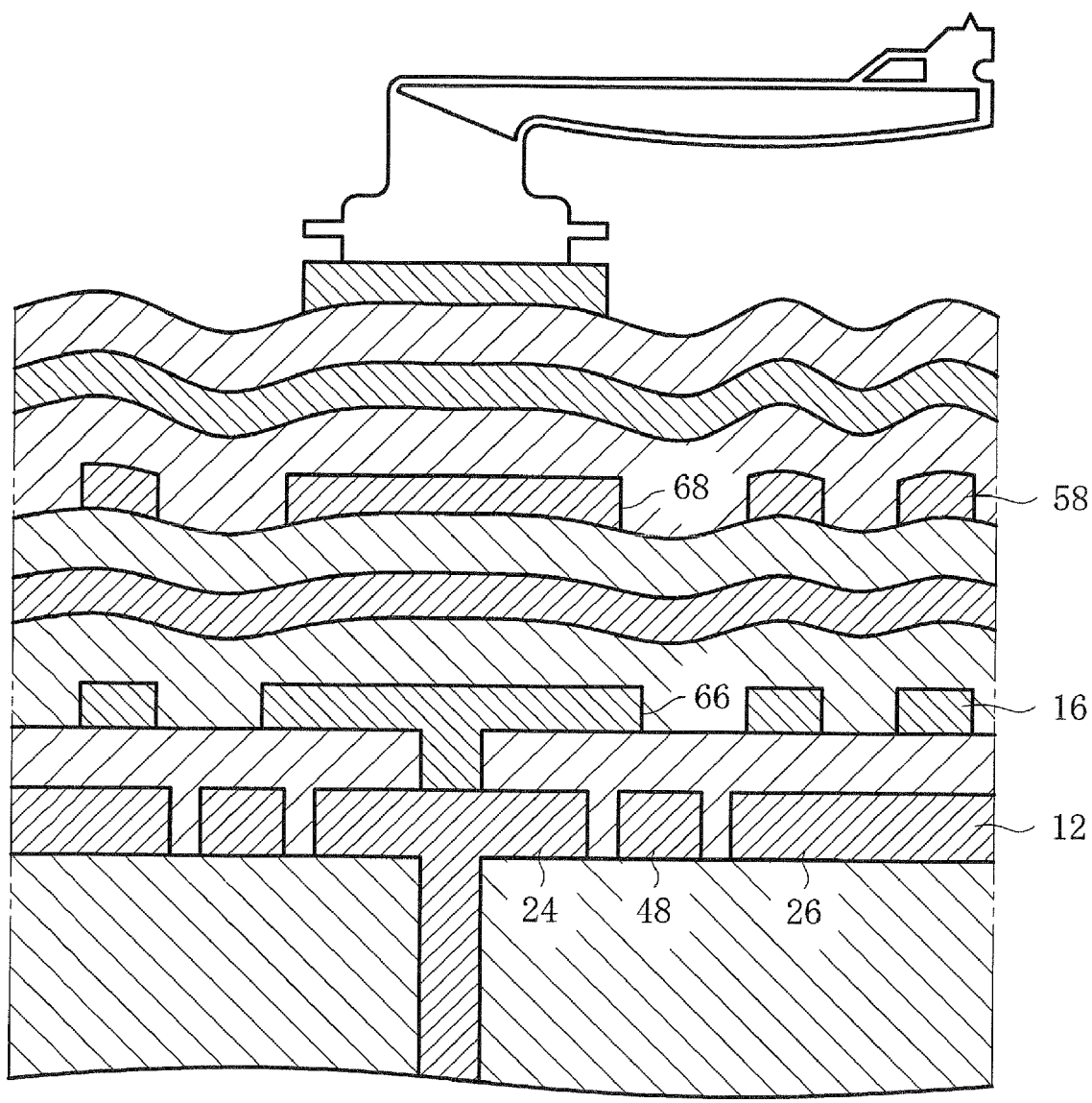
FIG. 6 is a side sectional view of a part of the probe unit substrate according to the fourth embodiment of the present invention.

FIG. 6 is a side sectional view of a part of the probe unit substrate according to the fourth embodiment of the present invention. This embodiment is similar to the second embodiment shown in FIG. 4, but further includes the flatness improvement rings 48 shown in FIG. 2. Namely, in FIG. 6, the first conductor layer 12 includes the through-hole junction pads 24, the flatness improvement rings 48 that surround the through-hole junction pads 24 and the grounding region 26 that further surrounds the flatness improvement rings 48. The second conductor layer 16 includes the planarization patterns 66, and the fourth conductor layer 58 includes the planarization patterns 68. This embodiment has advantageously a combination of the planarization effect of the flatness improvement rings 48 and the planarization effect of the planarization patterns 66 and 68.

Figure 7:
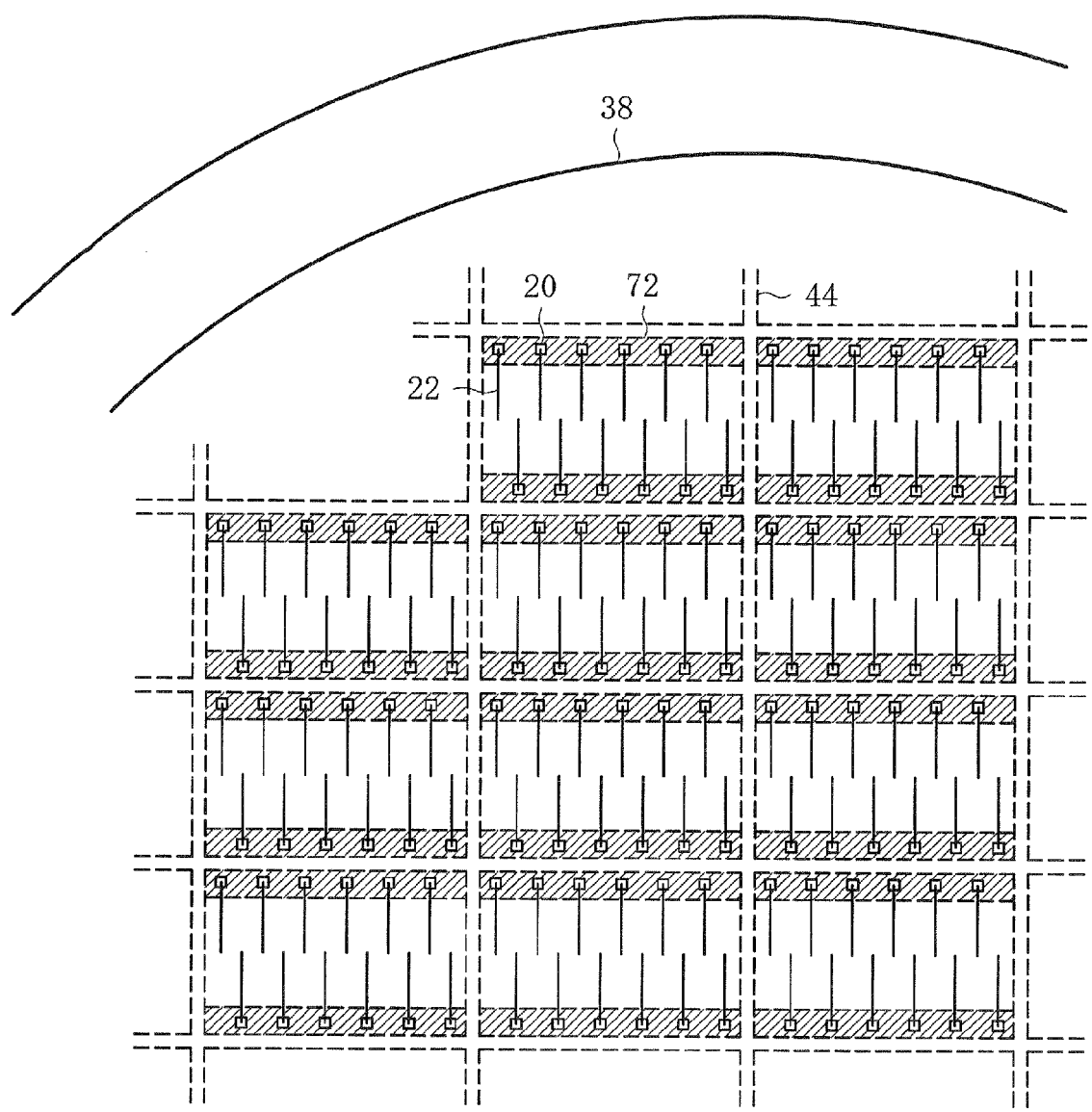
FIG. 7 is a fragmentary plan view of the probe card shown in FIG. 1 as viewed from the bottom of FIG. 1.

Next, the planar shape of the planarization pattern will be described. FIG. 7 is a fragmentary plan view of the probe card shown in FIG. 1 as viewed from the bottom of FIG. 1, the probe card being equipped with the probe unit substrate 38, which has the planarization patterns shown in FIG. 5. A number of probes 22 are mounted on the surface of the probe unit substrate 38. Imaginary scribe lines 44 for IC chips, which can be measured with the probe card, are shown by dashed lines. The planarization patterns 72 shown in FIG. 5 are formed inside the multilayer wiring division of the probe unit substrate 38. The probe mounting pads 20 are located above the planarization patterns 72. The planarization patterns 72 may be prepared one by one for the respective probe mounting pads 20, but in this embodiment one planarization pattern 72 is prepared for plural probe mounting pads 20, noting that the one planarization pattern 72 may be associated with any number of the probe mounting pads 20.

Figure 8:
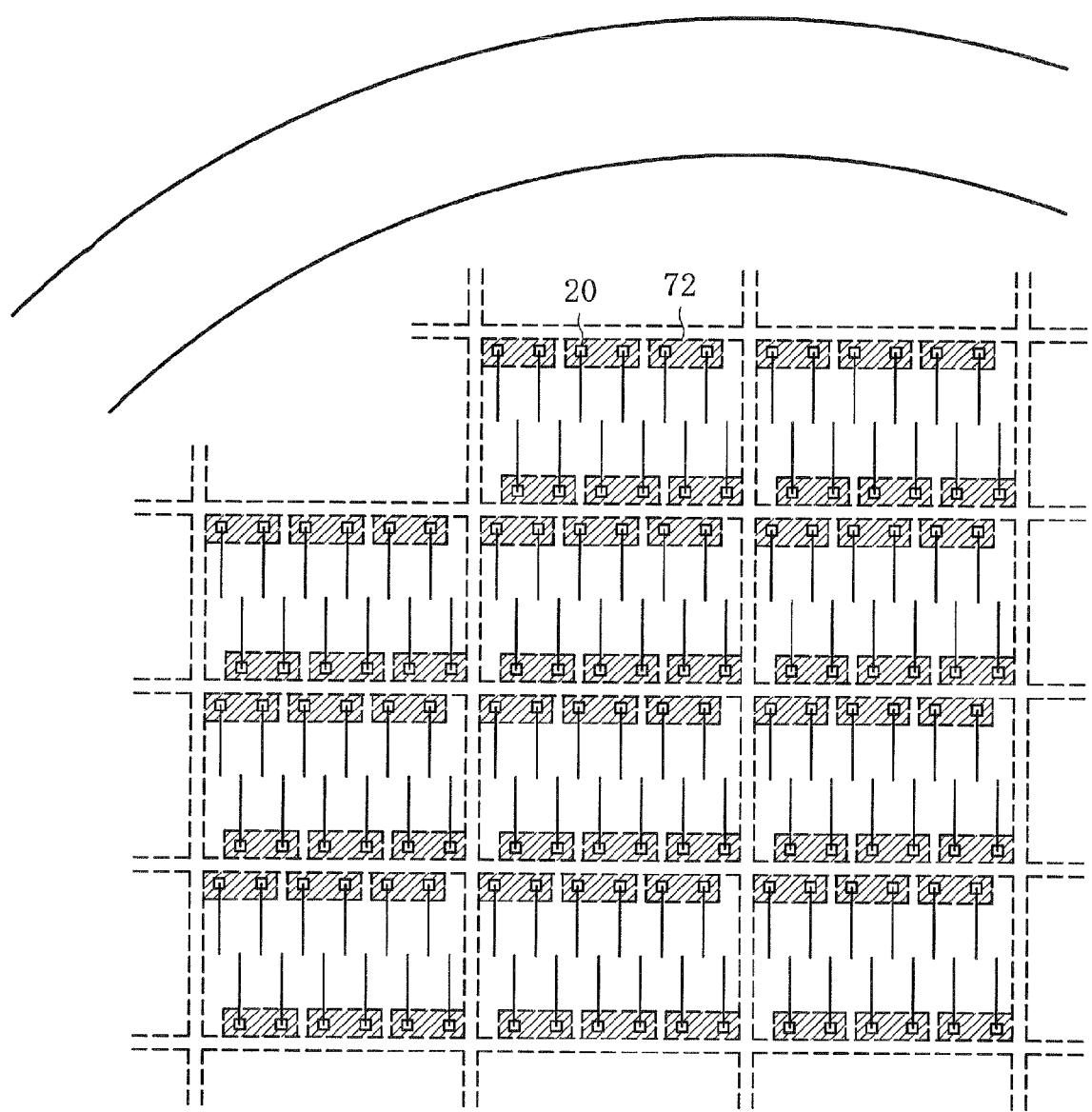
FIG. 8 is a fragmentary plan view illustrating a modified planar shape of the planarization pattern.

FIG. 8 is a fragmentary plan view illustrating a modified planar shape of the planarization pattern. This embodiment differs from the embodiment shown in FIG. 7 in the relationship between the planarization patterns 72 and the probe mounting pads 20. One planarization pattern 72 is associated with two probe mounting pads 20.

Figure 9:
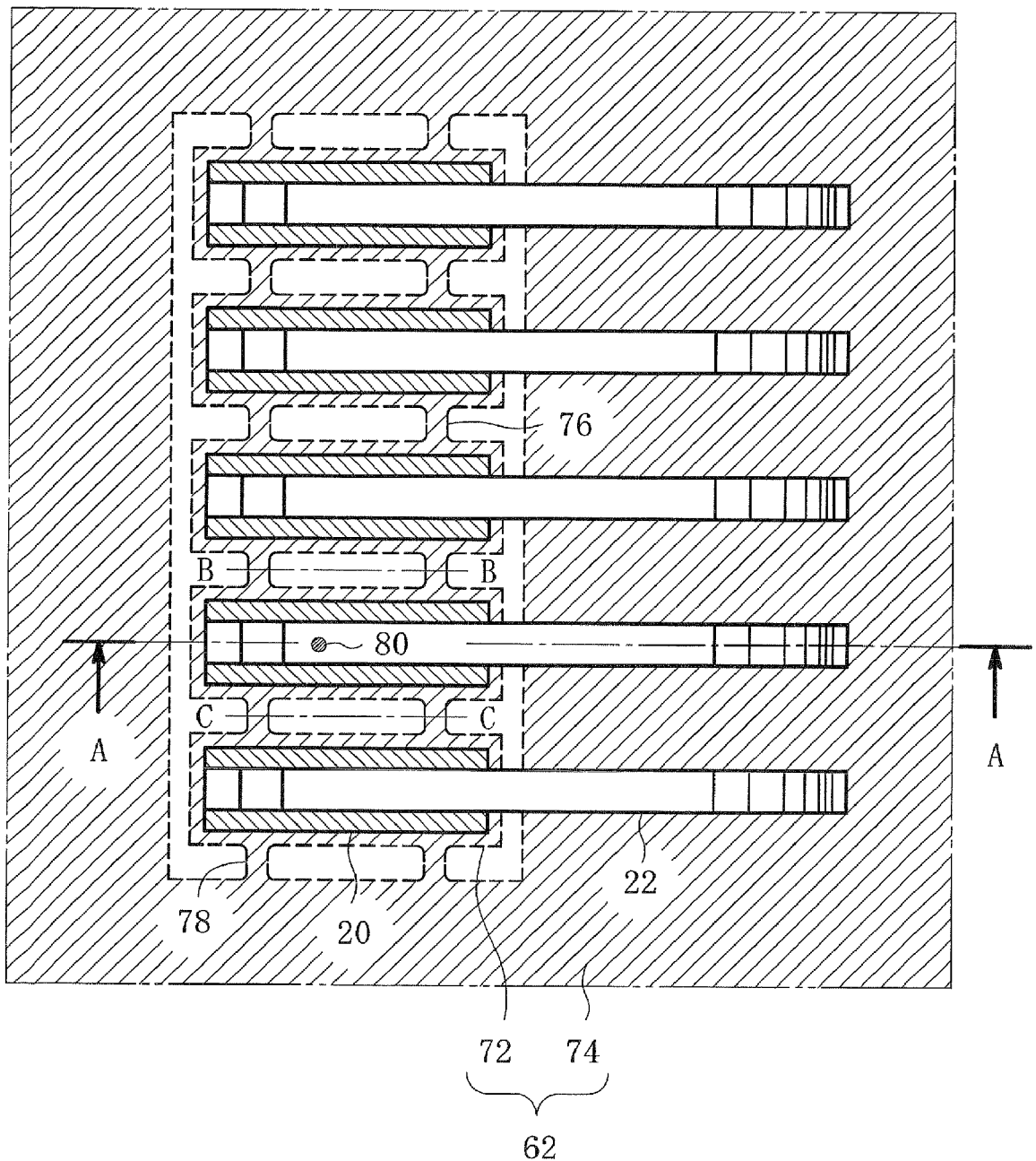
FIG. 9 is a fragmentary plan view illustrating another modified planar shape of the planarization pattern.

FIG. 9 is a fragmentary plan view illustrating another modified planar shape of the planarization pattern. The uppermost layer of the multilayer wiring division is the fifth insulating layer, and a number of probe mounting pads 20 are formed thereon. On the probe mounting pads 20 are fixed the probes 22. The fifth conductor layer 62 is located beneath the fifth insulating layer. The fifth conductor layer 62 (shown by hatching running from upper right to lower left) is a grounding layer, and includes a grounding region 74 and the planarization patterns 72, which are located beneath the probe mounting pads 20. If the conductor layer that is located beneath and close to the probe mounting pads 20 is the grounding layer, the grounding layer may have only a solid pattern, which covers almost all area. In this embodiment, however, in consideration of easiness of repairing a short circuit place as described later, the conductor layer includes the planarization patterns 72. The planarization patterns 72 are electrically connected with the grounding region 74, and compose a part of the grounding layer. The probe mounting pads 20 in this embodiment each has an elongate shape, and these probe mounting pads 20 are divided into groups, each group including plural pads. The planarization patterns 72, each of which may be associated with plural probe mounting pads belonging to one group, are connected to each other via narrow joints 76. The planarization patterns 72 are further connected to the grounding region 74 via other narrow joints 78. The widths of the narrow joints 76 and 78 are 50 to 100 micrometers for example.

Figure 10:
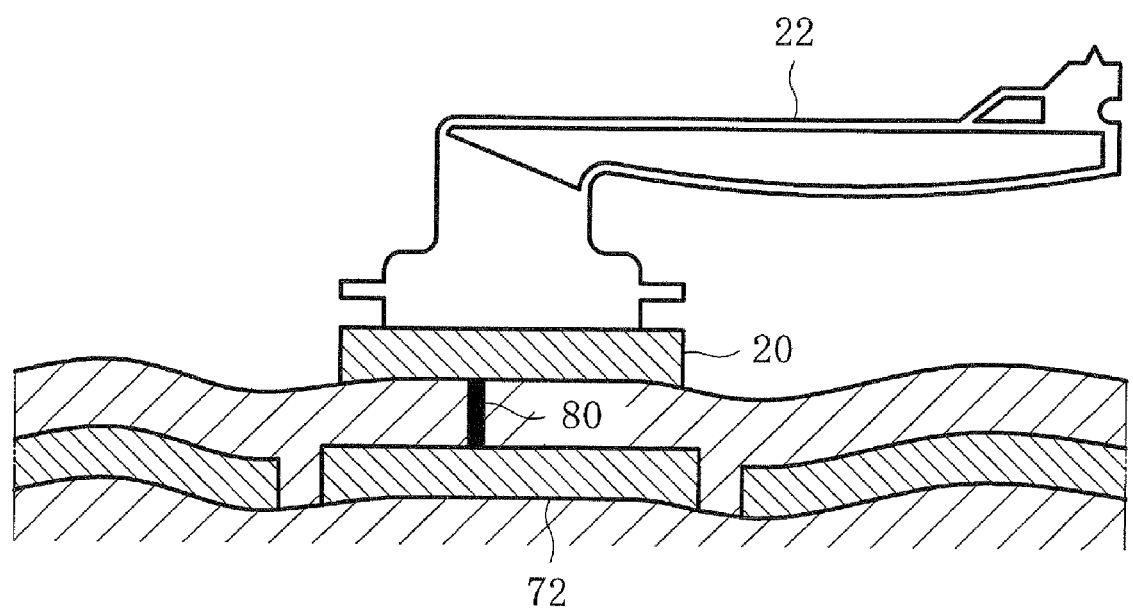
FIG. 10 is a sectional view taken along the line A-A in FIG. 9.
Figure 11:
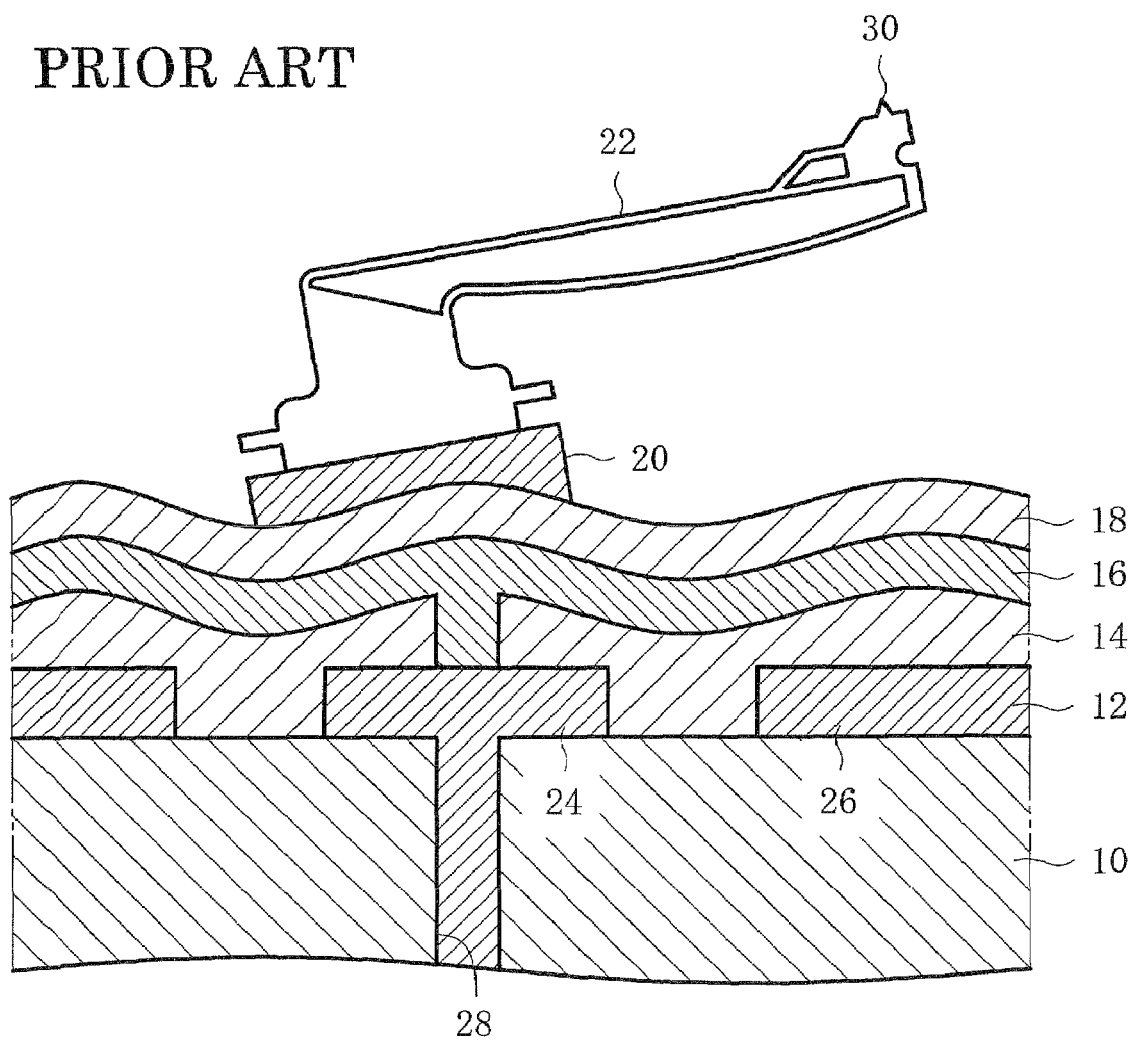
FIG. 11 is a sectional view illustrating a part of the conventional probe unit substrate in a magnified form.

FIG. 10 is a sectional view taken along the line A-A in FIG. 9. It is assumed that a short circuit place 80 (see also FIG. 9) has occurred for some reason between the probe mounting pad 20 and the planarization pattern 72. Since the planarization pattern 72 is at the ground potential as shown in FIG. 9, the above-described short circuit unfavorably brings the probe mounting pad 20 to the ground potential, so that the pad 20 can not feed, to the probe 22, an electrical signal for wafer testing. Then, it is necessary to repair the short circuit place 80. However, a repairing process by cutting the short circuit place per se would raise the risk of irregularity, which may be caused by the repairing process just beneath the probe mounting pad 20, and thus such a repairing process is not preferable. Therefore, in this embodiment, as shown in FIG. 9, the two joints 76 may be cut at the line B-B and the line C-C. When the joints 76 are cut, any irregularity would not occur just beneath the probe mounting pad 20. Even if any irregularity occurs after the repairing process, it would not affect the flatness of the probe mounting pad 20.

What is claimed is:

1. A probe unit substrate comprising:
   (a) an electrical insulating substrate having a surface;
   (b) a first conductor layer formed on the surface of the substrate, the first conductor layer including:
      first conductor patterns;
      flatness improvement rings surrounding the first conductor patterns with first clearances therebetween; and
      a second conductor pattern surrounding the flatness improvement rings with second clearances therebetween;
   (c) a first insulating layer covering over the first conductor layer;
   (d) at least one other conductor layer formed above the first insulating layer, and at least one other insulating layer covering over the other conductor layer; and
   (e) probe mounting pads formed on a surface of an uppermost insulating layer of the at least one other insulating layer.

2. The probe unit substrate according to claim 1, wherein the first conductor pattern of the first conductor layer is a through-hole junction pad, which is connected via a through-hole conductor to a wiring on another side of the electrical insulating substrate.

3. The probe unit substrate according to claim 1, wherein the second conductor pattern of the first conductor layer is a grounding region.

4. The probe unit substrate according to claim 1, wherein the first clearance between the flatness improvement ring and the first conductor pattern has a distance of 25 micrometers, and the second clearance between the flatness improvement ring and the second conductor pattern has a distance of 25 micrometers.

5. The probe unit substrate according to claim 1, wherein the probe unit further comprises micro cantilever type probes each having a root, which is fixed to one of the probe mounting pads.

* * * * *